`US010281069B2`

(12) United States Patent
Sharma et al.

(10) Patent No.: US 10,281,069 B2
(45) Date of Patent: May 7, 2019

(54) VACUUM SEALING FLANGE

(71) Applicant: Brookhaven Science Associates, LLC, Upton, NY (US)

(72) Inventors: Sushil Kumar Sharma, Medford, NY (US); Lewis Garth Doom, Jr., Stony Brook, NY (US); Christopher Amundsen, Commack, NY (US); Muhammad Aftab Hussain, Mount Sinai, NY (US); Frank A. DePaola, Moriches, NY (US); Frank Charles Lincoln, Patchogue, NY (US); Charles Hetzel, Wading River, NY (US); Charles S. De La Parra, Manorville, NY (US); Paul Edward Palecek, Jr., Ridge, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 283 days.

(21) Appl. No.: 15/036,186

(22) PCT Filed: Oct. 21, 2014

(86) PCT No.: PCT/US2014/061476
§ 371 (c)(1),
(2) Date: May 12, 2016

(87) PCT Pub. No.: WO2015/073169
PCT Pub. Date: May 21, 2015

(65) Prior Publication Data
US 2016/0290537 A1 Oct. 6, 2016

Related U.S. Application Data

(60) Provisional application No. 61/903,490, filed on Nov. 13, 2013.

(51) Int. Cl.
*F16L 23/032* (2006.01)
*F16L 23/16* (2006.01)
(Continued)

(52) U.S. Cl.
CPC ............. *F16L 23/032* (2013.01); *F16L 23/16* (2013.01); *H01J 37/32513* (2013.01); *F16L 23/20* (2013.01); *F16L 2201/40* (2013.01)

(58) Field of Classification Search
CPC . F16L 23/16; F16L 23/20; F16L 23/18; F16L 23/032
(Continued)

(56) References Cited

U.S. PATENT DOCUMENTS 3,211,478 A * 10/1965 Batzer ................. F16J 15/0881
277/608
3,989,285 A * 11/1976 Yancey ................ F16J 15/0881
277/614

(Continued)

OTHER PUBLICATIONS

PCT/US2014/061476 International Search Report and Written Opinion of the International Searching Authority, 16pp, dated Feb. 16, 2015.
(Continued)

*Primary Examiner* — Aaron M Dunwoody
(74) *Attorney, Agent, or Firm* — Dorene M. Price

(57) ABSTRACT

Flange technologies are described for a flange comprising a first and second side. Each side may include a knife edge surface disposed circumferentially around a base surface and a periphery section disposed around the knife edge surface. The knife edge surface and the periphery section are effective to define grooves therebetween. The flange may include an alloy with a relatively high thermal conductivity and yield strength. The flange may include water channels to remove heat.

24 Claims, 4 Drawing Sheets

(51) Int. Cl.
  *H01J 37/32* (2006.01)
  *F16L 23/20* (2006.01)
(58) Field of Classification Search
  USPC .................. 285/328, 336, 368, 363; 277/614
  See application file for complete search history.

(56) References Cited

U.S. PATENT DOCUMENTS

| | | | |
|---|---|---|---|
| 4,428,603 A | 1/1984 | Davlin | |
| 4,685,193 A * | 8/1987 | Faria | F16J 15/0881 29/428 |
| H439 H * | 3/1988 | Rehn | 285/148.11 |
| 4,892,321 A * | 1/1990 | Colgate | F16L 23/16 277/320 |
| 4,950,002 A * | 8/1990 | Hormansdorfer | F16J 15/062 277/625 |
| 4,988,130 A * | 1/1991 | Obara | F16L 23/20 138/89 |
| 5,163,712 A * | 11/1992 | Sabo | F16L 23/0286 285/24 |
| 5,384,662 A * | 1/1995 | Andresen | G01J 3/04 359/227 |
| 5,459,609 A * | 10/1995 | Schrag | G02B 7/007 359/513 |
| 5,630,592 A * | 5/1997 | Obara | F16J 15/0881 277/614 |
| 5,671,956 A * | 9/1997 | Crawford | F16L 23/032 285/328 |
| 5,700,014 A * | 12/1997 | Morita | B01J 3/03 277/614 |
| 5,836,623 A * | 11/1998 | Bothell | F16L 9/02 285/148.9 |
| 6,270,045 B1 * | 8/2001 | Crawford | B23K 33/00 220/584 |
| 6,443,354 B1 * | 9/2002 | Plochl | B23K 20/021 228/178 |
| 6,499,774 B1 * | 12/2002 | Smith | F16L 23/08 285/363 |
| 7,159,906 B1 * | 1/2007 | Vaudreuil | F16L 17/06 285/364 |
| 8,191,901 B2 * | 6/2012 | Crawford | F16L 23/20 277/608 |
| 2003/0011143 A1 * | 1/2003 | Shinoda | F16J 15/0881 277/614 |
| 2004/0124636 A1 * | 7/2004 | Crawford | F16L 23/024 285/363 |
| 2007/0040337 A1 * | 2/2007 | Wu | F16J 15/062 277/616 |
| 2008/0007065 A1 | 1/2008 | Kim | |
| 2008/0012325 A1 * | 1/2008 | Stay | G01C 19/661 285/354 |
| 2010/0230960 A1 * | 9/2010 | Konecny | F16L 23/20 285/336 |
| 2013/0108023 A1 * | 5/2013 | Deyhim | G21K 1/06 378/85 |
| 2013/0108025 A1 * | 5/2013 | Deyhim | G21K 1/046 378/146 |
| 2013/0146792 A1 * | 6/2013 | Deyhim | G21K 1/04 250/515.1 |
| 2013/0257044 A1 * | 10/2013 | Xi | F16L 23/20 285/363 |
| 2015/0021863 A1 * | 1/2015 | Wang | F16L 23/20 277/614 |
| 2016/0084707 A1 * | 3/2016 | Scott | G01J 3/0291 356/326 |
| 2016/0091092 A1 * | 3/2016 | Bothell | F16J 15/0881 220/378 |
| 2017/0314715 A1 * | 11/2017 | Schmalzbauer | F16L 23/026 |
| 2018/0119865 A1 * | 5/2018 | Chan | F16L 53/00 |

OTHER PUBLICATIONS https://web.archive.org/web/20121026115857/http://www.hoganas.com:80/en/Powder-Applications/GLIDCOP/ pp. 1-5, Oct. 26, 2012 (retrieved online Nov. 8, 2018).

https://web.archive.org/web/20130604030232/http://www.hoganas.com/en/Powder-Applications/GLIDCOP/Application-Examples/ pp. 1-5, Oct. 26, 2012 (retrieved online Nov. 8, 2018).

https://web.archive.org/web/20130604024816/http://www.hoganas.com/en/Powder-Applications/GLIDCOP/Features-Benefits/ pp. 1-4, Oct. 26, 2012 (retrieved online Nov. 8, 2018).

https://web.archive.org/web/20130604032301/http://www.hoganas.com/en/Powder-Applications/GLIDCOP/Product-Examples/ pp. 1-4, Oct. 26, 2012 (retrieved online Nov. 8, 2018).

Hoff, M. D., et al., "NSNS RFQ Mechanical Design", Proceedings of the 1997 Particle Accelerator Conference (Cat. No. 97CH36167) Vancouver, BC, Canada, May 16, 1997.

Valdiviez, R., et al., "The Use of Dispersion Strengthened Copper in Accelerator Designs" XX International Linac Conference, Monterey, California, Aug. 21, 2000.

* cited by examiner

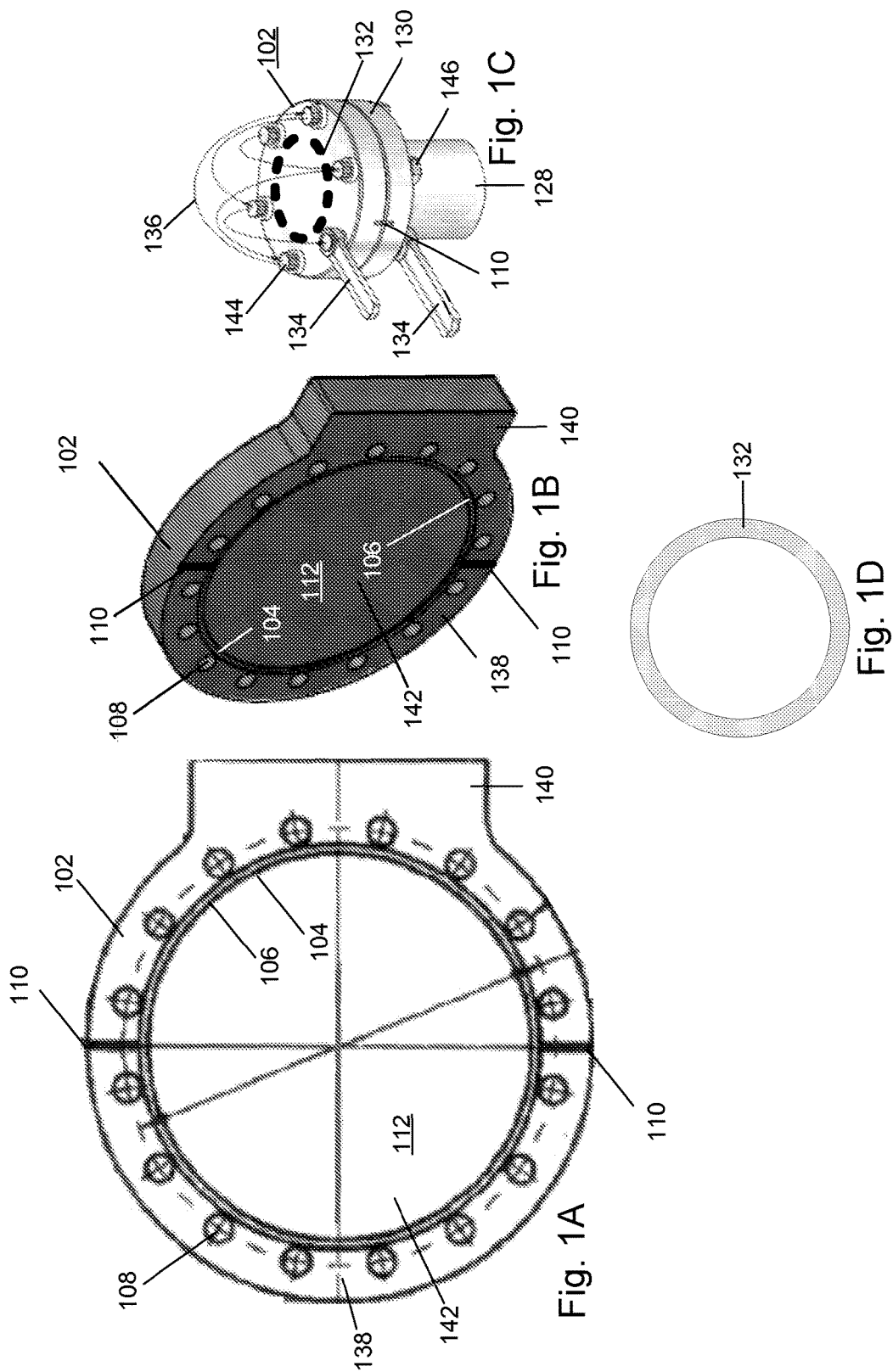

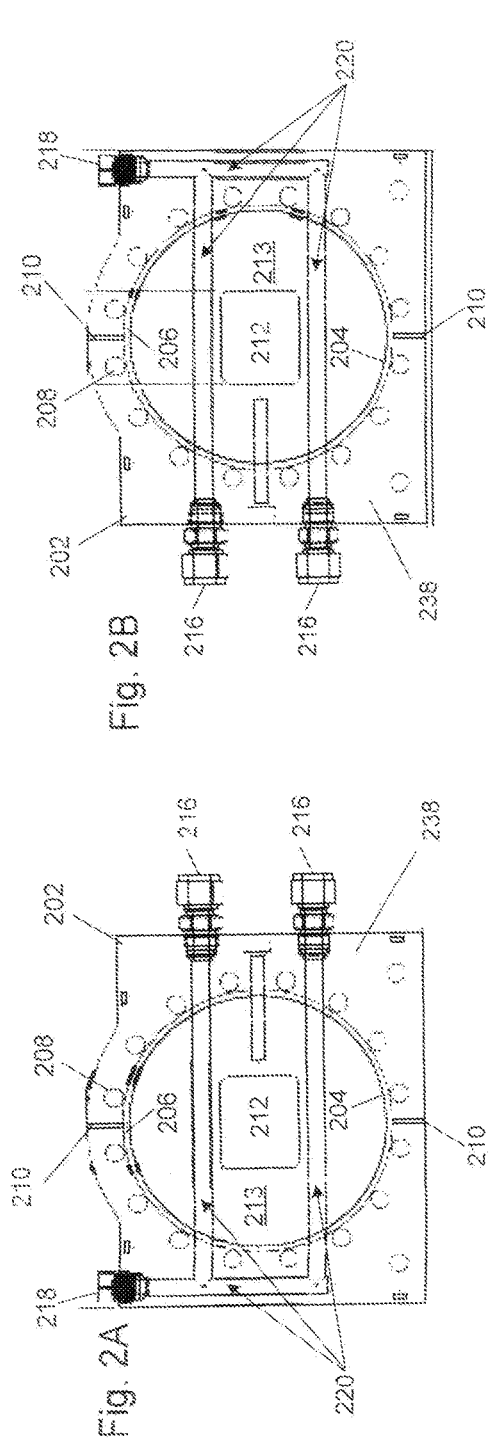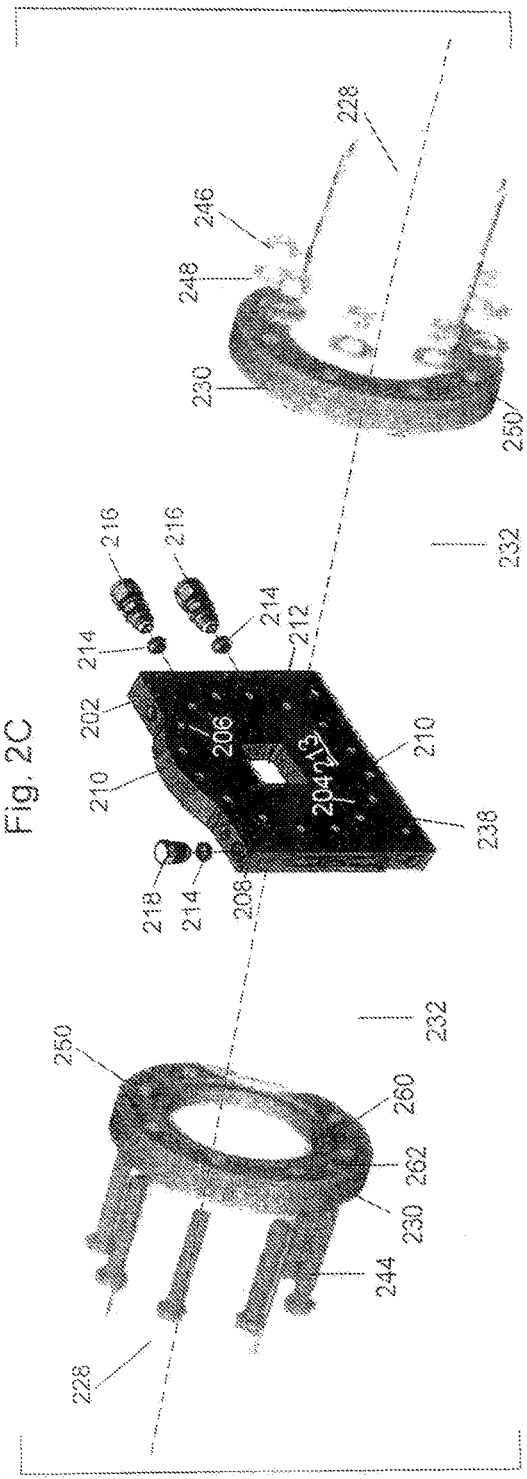

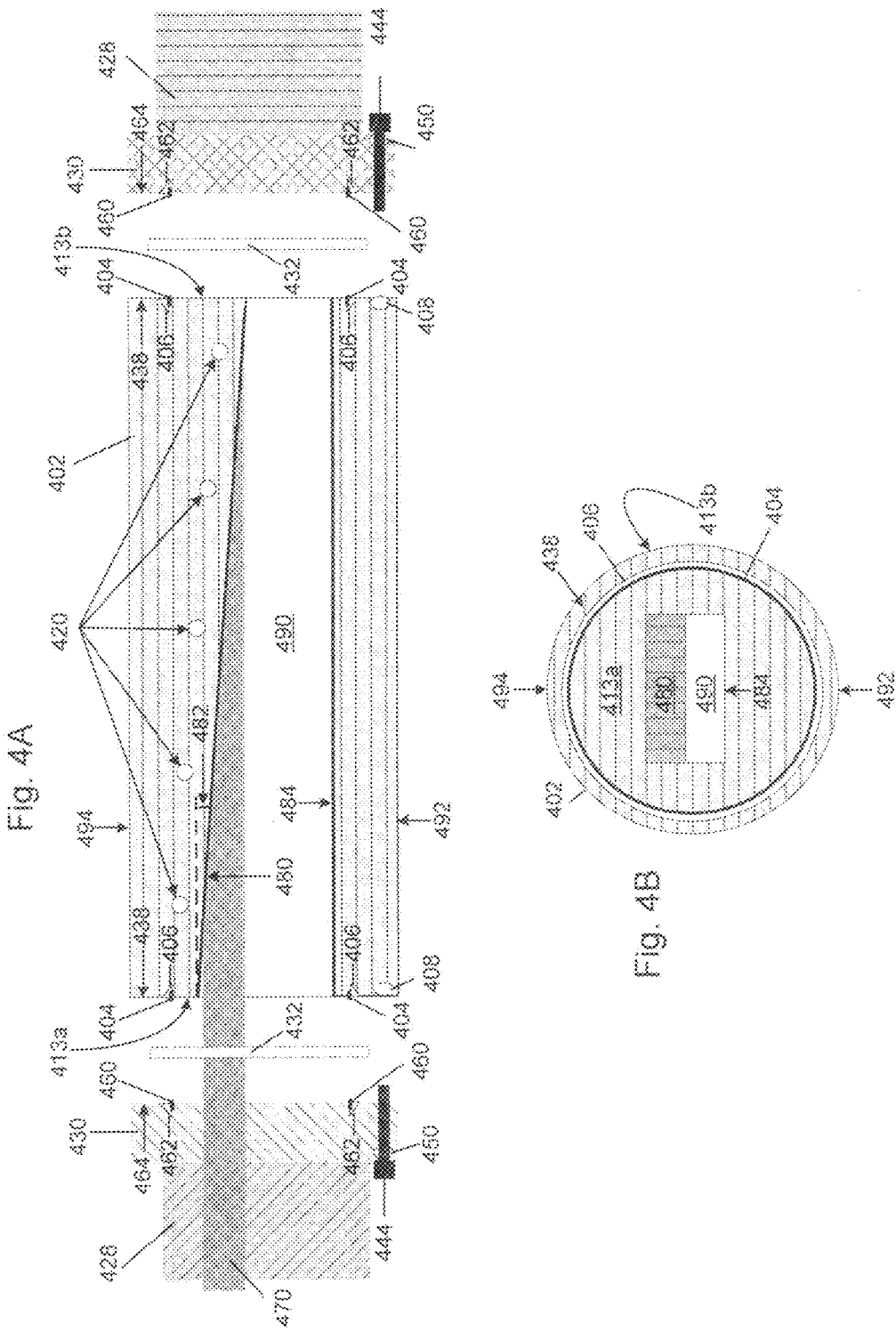

VACUUM SEALING FLANGE

STATEMENT OF GOVERNMENT RIGHTS

The present application was made with government support under contract number DE-AC02-98CH 10886 awarded by the U.S. Department of Energy. The United States government has certain rights in the invention.

CROSS REFERENCE TO RELATED APPLICATIONS

This application is related to U.S. Provisional Application No. 61/903,490 filed Nov. 13, 2013, the entirety of which is hereby incorporated by reference.

FIELD OF THE INVENTION

This application relates to vacuum sealing flanges functioning as water cooled masks, slits, stops, and windows.

BACKGROUND

Vacuum sealing flanges are used to connect vacuum chambers and tubing to each other. They are used in scientific and industrial applications for physical connections between various pieces of equipment. Vacuum sealing flanges are semi-permanent and may be frequently or occasionally disassembled. Some flange designs form a leak free seal by squeezing a soft gasket between harder flange surfaces.

SUMMARY

In some examples a flange is generally described. The flange may include a base surface with a circular cross-section. The flange may include a knife edge surface disposed circumferentially around the base surface. The flange may further include a periphery section disposed around the knife edge surface, wherein the periphery section includes walls that define bolt holes. The knife edge surface and the periphery section may be effective to define a groove therebetween. The flange may be comprised of an alloy with a thermal conductivity above 100 watt/m/° K.; and a yield strength above 190 MPa.

In some examples, a combination with the flange is generally described. The combination may include a first vacuum tube, a second vacuum tube and a flange sealed to the first and second vacuum tubes. The flange may include a first side and a second side. The first side may include a first base surface with a circular cross-section. The first side may include a first knife edge surface disposed circumferentially around the first base surface. The first side may include a first periphery section disposed around the first knife edge surface, the first periphery section includes walls that define bolt holes. The first knife edge surface and the first periphery section maybe effective to define a first groove therebetween. The second side may include a second base surface with a circular cross-section. The second side may include a second knife edge surface disposed circumferentially around the second base surface. The second side may include a second periphery section disposed around the second knife edge surface, the second periphery section includes walls that further define the bolt holes. The second knife edge surface and the second periphery section may be effective to define a second groove therebetween.

In some examples, a method for sealing a vacuum tube is generally described. The method may include placing a metal gasket between a vacuum tube and a flange. The method may include attaching the flange to the vacuum tube. The flange may include a base surface with a circular cross-section. The flange may include a knife edge surface disposed circumferentially around the base surface. The flange may include a periphery section disposed around the knife edge surface, wherein the periphery section includes walls that define bolt holes. The knife edge surface and the periphery section may be effective to define a groove therebetween. The flange may include an alloy with a thermal conductivity above 100 watt/m/° K and a yield strength above 190 MPa.

In some examples a flange is generally described. The flange may include a top surface and a bottom surface. The flange may include a first base surface with a circular cross-section. The flange may include a knife edge surface disposed circumferentially around the first base surface. The flange may further include a periphery section disposed around the knife edge surface, wherein the periphery section includes walls that define bolt holes. The knife edge surface and the periphery section may be effective to define a groove therebetween. The flange may include a second base surface with a circular cross-section. The flange may include walls that define internal cooling channels between the first base surface and the second base surface. The flange may include a first internal wall extending from the first base surface to the second base surface. A first distance between the first internal wall and either the top or bottom surface increases along a length of the flange. The change in the first distance may define a grazing incidence angle of the electromagnetic wave with respect to a plane substantially perpendicular to the first base surface. The flange may include a second internal wall extending from the first base surface to the second base surface. A second distance between the second internal wall and the first internal wall may define a channel effective to receive the electromagnetic wave within the flange. The flange may be comprised of an alloy with a thermal conductivity above 100 watt/m/° K.; and a yield strength above 190 MPa.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 1A is a top view of an example of a vacuum sealing stop flange;

FIG. 1B is a perspective view of an example vacuum sealing stop flange;

FIG. 1C is a perspective view of a system with a vacuum sealing stop flange attached to a vacuum tube;

FIG. 1D is top view of a seal that could be used when the vacuum sealing stop flange is attached to the vacuum tube;

FIG. 2A is a front view of a water cooled vacuum sealing mask flange;

FIG. 2B is a back view of a water cooled vacuum sealing mask flange;

FIG. 2C is a perspective view of a water cooled vacuum sealing mask flange positioned between two seals and two vacuum tube sections of a vacuum system;

FIG. 4A is a side view of an example extended water cooled vacuum sealing flange;

FIG. 4B is a front view of an example extended water cooled vacuum sealing flange;

Figure 3A:
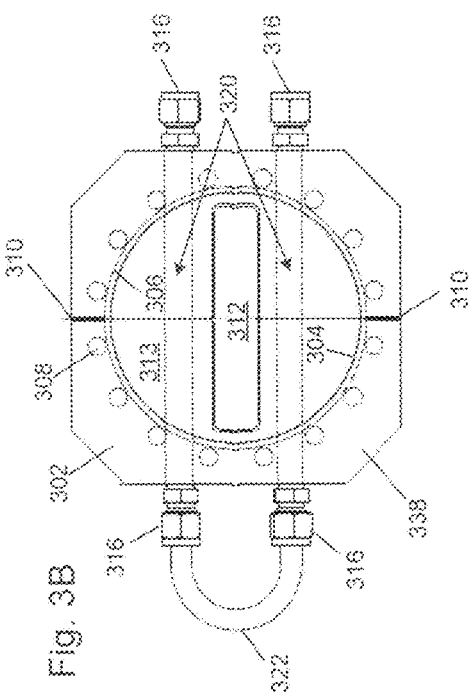
FIG. 3A is a front view of a water cooled vacuum sealing window flange.

all arranged according to at least some embodiments described herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

It will be understood that any compound, material or substance which is expressly or implicitly disclosed in the specification and/or recited in a claim as belonging to a group or structurally, compositionally and/or functionally related compounds, materials or substances, includes individual representatives of the group and all combinations thereof.

FIGS. 1A and 1B illustrate top and perspective views of an example vacuum sealing stop flange. FIG. 1C illustrates an example perspective view of a system with vacuum sealing stop flange attached to a vacuum tube. FIG. 1D is a top view of an example that could be used when the vacuum sealing stop flange is attached to the vacuum tube.

An example vacuum sealing stop flange 102 can have a variety of different shapes and configurations. In the example shown in FIGS. 1A and 1B, vacuum sealing stop flange 102 may include a base portion 140 with a rectangular cross-section integral with a stopping portion 142 having a circular cross-section.

Stopping portion 142 may include features such as base surface 112, a knife edge surface 104, and a periphery section 138. Periphery section 138 may include walls defining bolt holes 108 and walls defining leak check grooves 110. Knife edge 104 may be disposed circumferentially around the base surface 112 of vacuum sealing stop flange 102. Knife edge 104 and the inside edge of periphery section 138 may define a knife edge groove 106 therebetween. Leak check grooves 110 may be used to check for a leak in the vacuum seal when connected to a section of a vacuum system. Vacuum sealing stop flange 102 may provide a vacuum sealed stop at an end of a vacuum tube 128. Vacuum tube 128 may be connected on one side to a vacuum system which produces a vacuum. The vacuum may be a region with a gaseous pressure significantly less than atmospheric pressure to approximate perfect vacuum conditions of space that is empty of matter. The side of vacuum tube 128 not connected to the vacuum system may terminate in a vacuum tube flange 130.

Vacuum sealing stop flange 102 may be comprised of a material having properties that prevent electromagnetic wave penetration, resist thermal softening, has a relatively high thermal conductivity, a relatively high elevated temperature strength, and/or resistance to radioactive damage. For example, vacuum sealing stop flange 102 may include a material with thermal conductivity above 100 watt/m/° K, such as between 300 watt/m/° K and 400 watt/m/° K, or more specifically between 360 watt/m/° K and 370 watt/m/° K. Vacuum sealing stop flange 102 may include a material that may have a modulus of elasticity, also known as a Young's modulus, above 125 GPa, a yield strength of between 190 MPa and 215 MPa, electric conductivity of between 45 Meg S/m and 60 Meg S/m, and may be non-magnetic. For example, vacuum sealing stop flange 102 may be constructed from a copper alloy such as for example copper-chromium-zirconium. In another example, vacuum sealing stop flange 102 may be constructed from a copper based metal matrix composite alloy mixed with aluminum oxide ceramic particles, such as, for example, the material GLIDCOP®, available commercially. In an example, vacuum sealing stop flange 102 may be made of GLIDCOP AL-15, Unified Numbering System (UNS) alloy number UNS-C15715, and which includes 0.3 wt. % aluminum oxide in a copper matrix. Vacuum sealing stop flange 102 may also include about 200 ppm to 300 ppm boron.

As shown in FIG. 1C vacuum sealing stop flange 102 may be sealed to vacuum tube flange 130 at an end of vacuum tube 128 with bolts 144 through bolt holes 108 and corresponding bolt holes in vacuum tube flange 130. Nuts 146 may be applied on threaded ends of bolts 144.

Vacuum tube flange 130 may likewise have a knife edge disposed circumferentially around a base surface. Vacuum tube flange 130 may also have a periphery section with bolt holes. As shown in FIGS. 1C and 1D, a soft, metal gasket 132, may be placed between knife edge 104 of vacuum sealing stop flange 102 and a knife edge of vacuum tube flange 130. Soft, metal gasket 132 may be copper, oxygen free copper, nickel, aluminum or any other alloy. Bolts 144 with nuts 146 may be tightened with a wrench 134 to create a seal between vacuum tube flange 130 and vacuum sealing stop flange 102. Knife edge 104 and the knife edge of vacuum tube flange 130 may make annular grooves in each side of soft metal gasket 132 as bolts 144 and nuts 146 are tightened (as illustrated at 136). When knife edges make angular grooves in soft metal gasket 132, soft metal gasket 132 may deform and fill machining marks and surface imperfections in vacuum tube flange 130 and vacuum sealing stop flange 102 sealing vacuum sealing stop flange 102 to vacuum tube 128.

In an example, vacuum sealing stop flange 102 may be 1 to 2 inches in thickness or length and may prevent penetration of an electromagnetic wave with a power of about 50 W/mm, such as electromagnetic waves generated by bending magnets (BM), from penetrating through vacuum sealing stop flange 102 at normal incidence. In another example, vacuum sealing stop flange 102 may be up to 30 inches in thickness or length and may prevent penetration of an electromagnetic wave such as generated by insertion devices (ID), through vacuum sealing stop flange 102, when the electromagnetic wave is incident upon vacuum sealing stop flange 102 at a grazing incidence angle of about 3 degrees. As described in more detail below, vacuum sealing stop flange 102 may be water cooled.

FIGS. 2A, 2B, and 2C illustrate an example of a water cooled vacuum sealing mask flange, arranged in accordance with at least some embodiments described herein. FIGS. 2A and 2B illustrate front and back views of an example water cooled vacuum sealing mask flange. FIG. 2C illustrates a perspective view of an system of a water cooled vacuum sealing mask flange positioned between two vacuum tube sections of a vacuum system.

As shown in FIG. 2A and FIG. 2B, an example water cooled vacuum sealing mask flange 202 may include two sides and features on both sides such as a base surface 213, a knife edge 204 and a periphery section 238. Periphery section 238 may include walls defining bolt holes 208 and walls defining leak check grooves 210. Knife edge 204 and the edge of periphery section 238 may define a knife edge groove 206. Water cooled vacuum sealing mask flange 202 may include walls that define internal cooling channels 220. Base surface 213 may include walls defining a mask opening 212.

As shown in FIG. 2C, water cooled vacuum sealing mask flange 202 may provide a vacuum sealed mask when connected between flanges 230 of two vacuum tube sections 228 of a vacuum system. The sections of the vacuum system may be vacuum tubes or various pieces of equipment connected to the vacuum system. Water cooled vacuum sealing mask flange 202 may be attached between two vacuum tube flanges 230 within the vacuum system with bolts 244 through bolt holes 208 and through bolt holes 250 in vacuum tube flanges 230. A knife edge 204 may be disposed circumferentially around the base surface 213 of each side of water cooled vacuum sealing mask flange 202. Knife edge 204 and the inside edge of periphery section 238 may define a knife edge groove 206 therebetween on each side of water cooled vacuum sealing mask flange 202. Vacuum tube flanges 230 may likewise each have a knife edge 260 disposed circumferentially around a base surface. Vacuum tube flanges 230 may each include a periphery section 262 with walls defining bolt holes 250. Knife edge 260 and the inside edge of periphery section 262 may define a knife edge groove 206 in each vacuum tube flange 230. A soft metal gasket 232 may be placed between each knife edge 204 of water cooled vacuum sealing mask flange 202 and the corresponding knife edge 260 of each vacuum tube flange 230. Bolts 244 through bolt holes 208 and bolt holes 250 may be tightened with washers 248 and nuts 246 attached to the end of bolts 244 to create a vacuum seal between vacuum tube flanges 230 and water cooled vacuum sealing mask flange 202. Knife edges 204 and knife edge 260 may make annular grooves in each side of soft metal gaskets 232 as bolts 244 and nuts 246 are tightened. Soft metal gaskets 232 may deform and fill machining marks and surface imperfections in the base surface and recessed groove of both vacuum system flanges 230 and water cooled vacuum sealing mask flange 202. The deformation of soft metal gaskets 232 may provide a vacuum seal between water cooled vacuum sealing mask flange 202 and vacuum tube flanges 230.

The base surfaces 213 on both sides of water cooled vacuum sealing mask flange 202 may include walls that define mask 212. Mask 212 may be a hole through water cooled vacuum sealing mask flange 202. Mask 212 may be of any shape including a slit. Mask 212 may selectively allow light or other waves of a defined shape to pass through water cooled vacuum sealing mask flange 202. Water cooled vacuum sealing mask flange 202 may also include walls defining internal cooling channels 220. Internal cooling channels 220 may be machined internally within the structure of water cooled vacuum sealing mask flange 202 within periphery section 238 and base surface 213 as shown in FIGS. 2A-2C. Internal cooling channels 220 may loop around mask 212. One cooling channel 220 may be connected to a cooling water inlet stainless steel fitting 216, corresponding to an inlet of flange 202, and to copper fitting 214. The other cooling channel 220 may be connected to a cooling water outlet stainless steel fitting 216, corresponding to an outlet of flange 202, and copper fitting 214. The cooling water inlet and outlet may be interchangeable. Internal cooling channels 220 may also include a channel to a bleed valve 218 which may also include a copper fitting 214. Bleed valve 218 may be used to bleed off air within cooling channels 220. Water or another fluid flowed through cooling channels 220 may remove heat from water cooled vacuum sealing mask flange 202. Water flow rates may be between 0.2 gpm to 7 gpm.

Figure 3B:
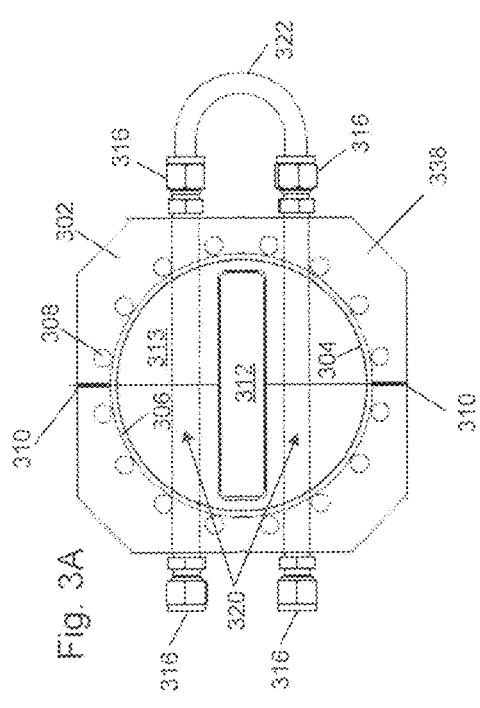
FIG. 3B is a back view of a water cooled vacuum sealing window flange.
Figure 3C:
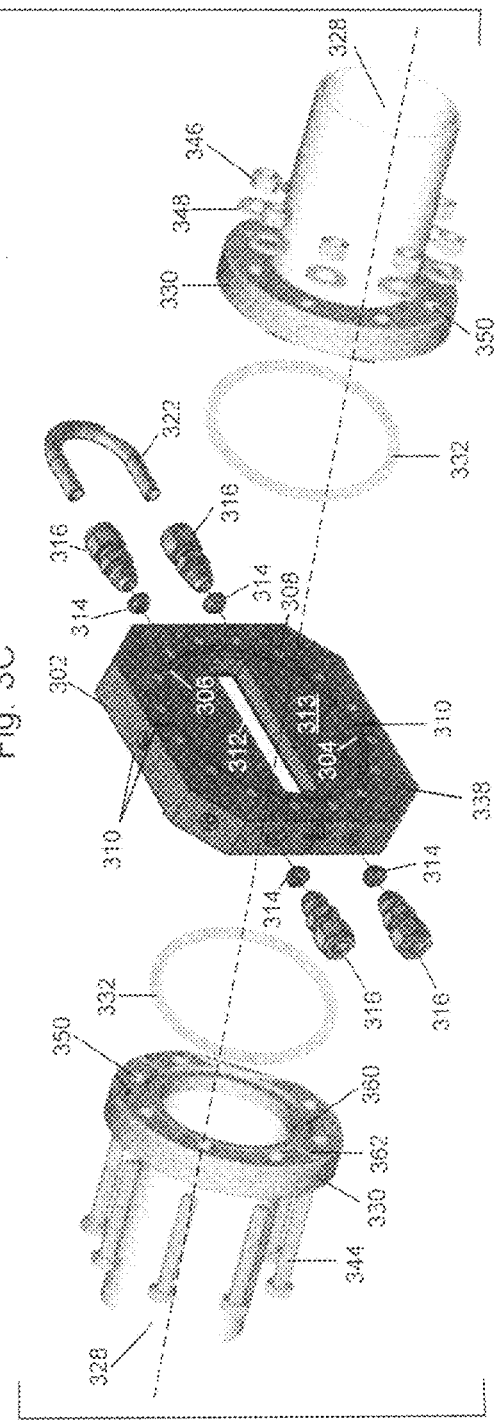
FIG. 3C is a perspective view of an example system of a water cooled vacuum sealing window flange positioned between two seals and two vacuum tube sections of a vacuum system.

FIGS. 3A, 3B, and 3C illustrate an example of a water cooled vacuum sealing window flange, arranged in accordance with at least some embodiments described herein. FIGS. 3A and 3B illustrate front and back views of an example water cooled vacuum sealing window flange. FIG. 3C illustrates a perspective view of an example water cooled vacuum sealing window flange positioned between two vacuum tube sections of a vacuum system.

As shown in FIG. 3A and FIG. 3B, an example water cooled vacuum sealing window flange 302 may include two sides and features on both sides such as a base surface 313, a knife edge 304, and a periphery section 338. Periphery section 338 may include walls defining bolt holes 308 and walls defining leak check grooves 310. Knife edge 304 and the edge of periphery section 338 may define a knife edge groove 306. Water cooled vacuum sealing window flange 302 may include walls that define internal cooling channels 320. Base surface 313 may include walls defining a window 312.

As shown in FIG. 3C, water cooled vacuum sealing window flange 302 may provide a vacuum sealed window when connected between flanges 330 of two vacuum tube sections 328 of a vacuum system. Water cooled vacuum sealing window flange 302 may be attached between two vacuum tube flanges 330 within the vacuum system with bolts through bolt holes 308 and bolt holes 350 in vacuum tube flanges 330. A knife edge 304 may be disposed circumferentially around the base surface 313 of each side of water cooled vacuum sealing window flange 302. Knife edge 304 and the inside edge of periphery section 338 may define a knife edge groove 306 on each side of water cooled vacuum sealing window flange 302. Vacuum tube flanges 330 may likewise each have a knife edge 360 disposed circumferentially around a base surface. Vacuum tube flanges 330 may each include a periphery section 362 with walls defining bolt holes 350. Knife edge 360 and the inside edge of periphery section 362 may define a knife edge groove in each vacuum tube flange 330. A soft metal gasket 332 may be positioned between each knife edge 304 of water cooled vacuum sealing window flange 302 and knife edge 360 of each vacuum tube flange 330. Bolts 344 through bolt holes 308 and bolt holes 350 in vacuum system flanges may be tightened with washers 348 and nuts 346 attached to the end of bolts 344 to create a vacuum seal between vacuum tube flanges 330 and water cooled vacuum sealing window flange 302. Knife edges 304 and knife edges 360 may make annular grooves in each side of soft metal gaskets 332 as bolts 344 and nuts 346 are tightened. Soft metal gaskets 332 may deform and fill machining marks and surface imperfections in the base surface and recessed groove of both vacuum system flanges 330 and water cooled vacuum sealing window flange 302. The deformation of soft metal gaskets 332 may provide a vacuum seal between water cooled vacuum sealing window flange 302 and vacuum tube flanges 330.

Window 312 may be made from beryllium or diamond. Window 312 may be disposed in water cooled vacuum sealing window flange 302 at an opening defined by base surfaces 313 on both sides of water cooled vacuum sealing window flange 302. Window 312 may selectively allow light or other waves of a defined shape to pass through water cooled vacuum sealing window flange 302 while maintaining a vacuum seal to both sides of water cooled vacuum sealing window flange 302. Water cooled vacuum sealing window flange 302 may also include walls defining internal cooling channels 320. Internal cooling channels 320 may be machined internally within periphery section 338 and base surface 313 as shown in FIGS. 3A-3C. Internal cooling channels 320 may pass through water cooled vacuum sealing window flange 302 above and below window 312. Internal cooling channels 320 may be connected to each other on one end by way of stainless steel tubing 322, by a stainless steel fitting 316 and a copper fitting 314. One cooling channel 320 may be connected to a cooling water inlet stainless steel fitting 316, corresponding to an inlet of flange 302, and to copper fitting 314. The other cooling channel 320 may be connected to a cooling water outlet stainless steel fitting 316, corresponding to an outlet of flange 302, and to copper fitting 314. The cooling water inlet and outlet may be interchangeable. Water or another fluid flowed through cooling channels 320 may remove heat from water cooled sealing window flange 302. Water flow rates may be between 1 gpm to 7 gpm.

For example, a water cooled vacuum sealing window flange 302 may provide a vacuum seal between two vacuum tubes while the window portion of the flange may selectively allow light or other waves of a defined shape to pass through. The vacuum properties on the two sides of the flange may be different. The flange may also protect the integrity of a vacuum on one side of the flange if the vacuum on the other side of the flange is compromised.

FIG. 4A is a side view of an example extended water cooled vacuum sealing flange, arranged in accordance with at least some embodiments described herein. Extended water cooled vacuum sealing flange 402 may be a stop flange, a mask flange, or a window flange. Extended water cooled vacuum sealing flange 402 may provide a vacuum seal when connected between vacuum tube flanges 430 of two vacuum tube sections 428 of a vacuum system. Extended water cooled vacuum sealing flange 402 may be attached between two vacuum tube flanges 430 within a vacuum system with bolts 444 through bolt holes 408 and through bolt holes 450 in vacuum tube flanges 430. A knife edge 404 may be disposed circumferentially around base surface 413a and 413b of each side of water cooled vacuum sealing flange 402. Knife edge 404 and the inside edge of periphery section 438 may define a knife edge grove 406 therebetween on each side of extended water cooled vacuum sealing flange 402. Vacuum tube flanges 430 may likewise each have a knife edge 460 disposed circumferentially around a base surface. Vacuum tube flanges 430 may each include a periphery section 464 with walls defining bolt holes 450. Knife edge 460 and the inside edge of periphery section 464 may define a knife edge grove 462 in each vacuum tube flange 430. A soft metal gasket 432 may be placed between each knife edge 404 of extended water cooled vacuum sealing flange 402 and the corresponding knife edge 460 of each vacuum tube flange 430. Bolts 444 through bolt holes 408 and bolt holes 450 may be tightened to create a vacuum seal between vacuum tube flanges 430 and extended water cooled vacuum sealing flange 402. Knife edges 404 and knife edges 460 may make annular groves in each side of soft metal gaskets 432 as bolts 444 are tightened. Soft metal gaskets 432 may deform and fill machining marks and surface imperfections in the base surfaces and recessed knife edge groves 462 and 406 of vacuum system flanges 430 and extended water cooled vacuum sealing flanges 402 respectively. The deformation of soft metal gaskets 432 may provide a vacuum seal between extended water cooled vacuum sealing flange 402 and vacuum tube flanges 430.

Extended water cooled vacuum sealing flange 402 may receive an electromagnetic wave 470. Extended water cooled vacuum sealing flange 402 may prevent penetration of electromagnetic wave 470, or prevent a portion of electromagnetic wave 470 incident upon extended water cooled vacuum sealing flange 402, from penetrating through extended water cooled vacuum sealing flange 402. Extended water cooled vacuum sealing flange 402 may prevent penetration of electromagnetic wave 470 such as electromagnetic wave 470 generated by insertion devices (ID). Extended water cooled vacuum sealing flange 402 may be constructed such that when connected between vacuum tube flanges 430 of two vacuum tube sections 428 of a vacuum system, electromagnetic wave 470 may incidence upon extended water cooled vacuum sealing flange 402 at a grazing incidence angle. Extended water cooled vacuum sealing flange 402 may include a bottom surface 492 and a top surface 494. Internal walls 480 and 484 may extend from base surface 413a on one side of extended water cooled vacuum sealing flange 402 to base surface 413b on other side of extended water cooled vacuum sealing flange 402. Internal walls 480 and 484 may define electromagnetic wave channel 490. Internal wall 480 may gradually increase in distance from either top surface 494 or bottom surface 492 of extended water cooled vacuum sealing flange 402 along the length of extend water cooled vacuum sealing flange 402 (as shown in FIG. 4A, internal wall 480 gradually increases in distance from top surface 494). The change in the distance between internal wall 480 and either top surface 494 or bottom surface 492 may define an angle 482 with respect to a plane substantially perpendicular to base surface 413a. Angle 484 may be a grazing incidence angle for electromagnetic wave 470. Angle 482 may be about 3 degrees.

Extended water cooled vacuum sealing flange 402 may be up to 30 inches in thickness or length and may include walls defining multiple cooling channels 420. Cooling channels 420 may be arranged proximate to internal wall 480. Internal wall 480 may be located on an upper side of electromagnetic wave channel 490 (as shown in FIG. 4A). Cooling channels 420 may be arranged parallel to each other and parallel to base surfaces 413a and 413b, and may be spaced from about 1 inch to about 2 inches apart along the thickness or length of extended water cooled vacuum sealing flange 402. Cooling channels 420 may be connected to each other with water fittings. Cooling channels 420 may be drilled at an angle from a center axis of extended water cooled vacuum sealing flange 402 to stay clear of knife edges 404 of extended water cooled vacuum sealing flange 402. For example, cooling channels 420 may increase in distance from either top surface 494 or bottom surface 492 of extended water cooled vacuum sealing flange 402 along the length of extended water cooling vacuum sealing flange 402.

FIG. 4B is a front view of an example extended water cooled vacuum sealing flange, arranged in accordance with at least some embodiments described herein. Internal walls 480 and 484 may define electromagnetic wave channel 490. Electromagnetic wave channel 490 may have a rectangular cross section and may reduce in size along the length of extended water cooling vacuum sealing flange 402. For example, extended water cooling vacuum sealing flange 402 may be a stop flange and internal wall 480 may extend towards and connect with internal wall 484 proximate to base surface 413b, such that all penetration of electromagnetic wave 470 is prevented. In another example, extended water cooling vacuum sealing flange 402 may be a mask flange and internal wall 480 may extend towards but not connect with internal wall 484 proximate to base surface 413b (as shown in FIG. 4A). Extended water cooled vacuum sealing flange 204 may prevent a portion of electromagnetic wave 470 incident upon extended water cooled vacuum sealing flange 402 from penetrating through extended water cooled vacuum sealing flange 402. In another example, extended water cooling vacuum sealing flange 402 may be a window flange and internal wall 480 may extend towards but not connect with internal wall 484 so as to define a window opening through base surface 413b. A window may be disposed in the window opening and may be made from beryllium or diamond. A window may selectively allow light or other waves of a defined shape to pass through water cooled vacuum sealing flange 402 while maintaining a vacuum seal to both sides of water cooled vacuum sealing flange 402.

Among other potential benefits, flanges in accordance with at least some of the disclosure may be used in a vacuum system and may provide desired thermal conductivity and yield strength but need not require brazing of separate materials with each desired property. It may also eliminate welding and thereby the chance of adding undesired magnetic properties. The production process may require less steps and have less chances for error. Production efficiency and cost per item may improve due to less intermediary products requiring less storage and fewer quality inspections. The production process may also take less time.

Flanges in accordance with at least some of the disclosure may be thinner than devices made from separate components and materials. A device thickness or length that may otherwise be over six inches, may decrease to one inch with use of the described flange. A water cooled vacuum sealing window flange may preserve valuable lab or manufacturing space for other components of a vacuum system. It may also weigh less and may not require additional support within the vacuum system.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A flange comprising:
   a base surface with a circular cross-section;
   a knife edge surface disposed circumferentially around the base surface;
   a periphery section disposed around the knife edge surface, wherein the periphery section includes walls that define bolt holes;
   wherein the knife edge surface and the periphery section are effective to define a groove therebetween;
   wherein the base surface is a first base surface;
   the knife edge is a first knife edge;
   the periphery section is a first periphery section;
   the flange is comprised of an alloy having a thermal conductivity above 100 watt/m/K; a yield strength above 190 MPa; and includes a first side, wherein the first side includes the first base surface, the first knife edge, and the first periphery section;
   the flange further includes a second side, where the second side
   includes:
   a second base surface with a circular cross-section;
   a second knife edge surface disposed circumferentially around the second base surface;
   a second periphery section disposed around the second knife edge surface; the second periphery section includes walls that further define the bolt holes;
   the second knife edge surface and the second periphery section are effective to define a second groove therebetween; and wherein
   the first and second base surfaces are effective to define a mask opening through the flange; and
   the flange further includes walls that define internal cooling channels within the first and second periphery sections and the first and second base surfaces.

2. The flange of claim 1, where the alloy has a thermal conductivity of between 300 watt/m/° K and 400 watt/m/° K.

3. The flange of claim 1, where the alloy has a thermal conductivity of between 360 watt/m/° K and 370 watt/m/° K.

4. The flange of claim 1, where the alloy has a yield strength of between 90 MPa and 215 MPa.

5. The flange of claim 1, where the alloy has an electric conductivity of between 45 Meg S/m. and 60 Meg S/m.

6. The flange of claim 1, where the alloy has a modulus of elasticity of between 110 GPa and 140 GPa.

7. The flange of claim 1, where the alloy is a copper based metal matrix composite alloy mixed with aluminum oxide ceramic particles.

8. The flange of claim 1, where the alloy includes 0.3 wt. % aluminum oxide in a copper matrix.

9. The flange of claim 8, where the alloy further includes 200 ppm to 300 ppm boron.

10. The flange of claim 1, wherein the flange is sized and structured so that the flange maintains a vacuum seal to a vacuum tube when connected to the vacuum tube.

11. A flange effective to receive an electromagnetic wave, the flange comprising:
    a top surface;
    a bottom surface;
    a first base surface with a circular cross-section;
    a knife edge surface disposed circumferentially around the first base surface;
    a periphery section disposed around the knife edge surface, wherein the periphery section includes walls that define bolt holes and the knife edge surface and the periphery section are effective to define a groove therebetween;
    a second base surface with a circular cross section;
    walls that define internal cooling channels between the first base surface and the second base surface;

a first internal wall extending from the first base surface to the second base surface, a first distance between the first internal wall and either the top or bottom surface increases along a length of the flange, the change in the first distance defining a grazing incidence angle of the electromagnetic wave with respect to a plane substantially perpendicular to the first base surface;

a second internal wall extending from the first base surface to the second base surface, a second distance between the second internal wall and the first internal wall defining a channel effective to receive the electromagnetic wave within the flange; and the flange is comprised of an alloy with:
a thermal conductivity above 100 watt/m/° K.; and a yield strength above 190 MPa.

12. The flange of claim 11, wherein the walls defining the first and second cooling channels are arranged so that the first and second cooling channels are parallel to the first base surface and the second base surface, and the first cooling channel is parallel to the second cooling channel.

13. The flange of claim 12, wherein the cooling channels are spaced from about 1 inch to about 2 inches apart along the length of the flange.

14. The flange of claim 13, wherein a third distance of the cooling channels, from either the top or bottom surface increases along the length of the flange.

15. The flange of claim 12, wherein the first cooling channel is connected to the second cooling channel.

16. The flange of claim 11, wherein the grazing incidence angle is about 3 degrees.

17. The flange of claim 11, wherein the first internal wall meets the second internal wall proximate to the second base surface to form a stop flange.

18. The flange of claim 17, wherein the flange is constructed from copper-chromium-zirconium.

19. The flange of claim 11, wherein the first internal wall is spaced from the second internal wall by a third distance proximate to the second base surface to form a mask flange.

20. The flange of claim 11, wherein the first internal wall is spaced from the second internal wall by a third distance proximate to the second base surface, the first internal wall and the second internal wall are effective to define a window opening through the second base surface, and the flange further comprises a window disposed in the window opening.

21. The flange of claim 20, wherein the window includes beryllium or diamond.

22. A flange comprising:
a base surface with a circular cross-section;
a knife edge surface disposed circumferentially around the base surface;
a periphery section disposed around the knife edge surface, wherein the periphery section includes walls that define bolt holes; and
wherein the knife edge surface and the periphery section are effective to define a groove therebetween;
wherein the base surface is a first base surface;
the knife edge is a first knife edge;
the periphery section is a first periphery section;
the flange is comprised of an alloy having a thermal conductivity above 100 watt/m/° K.; a yield strength above 190 MPa; and includes a first side, wherein the first side includes the first base surface, the first knife edge, and the first periphery section;
the flange further includes a second side, where the second side includes:

a second base surface with a circular cross-section;
a second knife edge surface disposed circumferentially around the second base surface;
a second periphery section disposed around the second knife edge surface;
the second periphery section includes walls that further define the bolt holes;
the second knife edge surface and the second periphery section are effective to define a second groove therebetween; and wherein
the first and second base surfaces are effective to define a window opening through the flange, wherein the window includes beryllium or diamond; and the flange further includes walls that define internal cooling channels within the first and second periphery sections and the first and second base surfaces.

23. A combination of a first vacuum tube, a second vacuum tube, and a flange sealed to the first and second vacuum tubes, the flange comprising:
a first side and a second side;
the first side including:
a first base surface with a circular cross-section;
a first knife edge surface disposed circumferentially around the first base surface; and
a first periphery section disposed around the first knife edge surface, the first periphery section includes walls that define bolt holes; wherein
the first knife edge surface and the first periphery section are effective to define a
first groove therebetween;
the second side including:
a second base surface with a circular cross-section;
a second knife edge surface disposed circumferentially around the second base surface;
a second periphery section disposed around the second knife edge surface, the second periphery section includes walls that further define the bolt holes; and
the second knife edge surface and the second periphery section effective to define a second groove therebetween;
wherein the flange is an alloy with a thermal conductivity above 100 watt/m/° K.; and a yield strength above 190 MPa;
the first and second base surfaces are effective to define a mask opening through the flange; and
the flange further includes walls that define internal cooling channels within the first and second periphery sections and the first and second base surfaces.

24. A combination of a first vacuum tube, a second vacuum tube, and a flange sealed to the first and second vacuum tubes, the flange comprising:
a first side and a second side;
the first side including:
a first base surface with a circular cross-section;
a first knife edge surface disposed circumferentially around the first base surface; and
a first periphery section disposed around the first knife edge surface, the first periphery section includes walls that define bolt holes; wherein
the first knife edge surface and the first periphery section are effective to define a
first groove therebetween;
the second side including:
a second base surface with a circular cross-section;

a second knife edge surface disposed circumferentially around the second base surface;
a second periphery section disposed around the second knife edge surface, the second periphery section includes walls that further define the bolt holes; and
the second knife edge surface and the second periphery section effective to define a second groove therebetween;
wherein the flange is an alloy with a thermal conductivity above 100 watt/m/° K.; and a yield strength above 190 MPa;
the first and second base surfaces are effective to define a window opening through the flange, wherein the window includes beryllium or diamond;
the flange further includes walls that define internal cooling channels within the first and second periphery sections and the first and second base surfaces;
the combination further comprises a window disposed in the window opening; and
the first and second vacuum tubes have different vacuum properties.

\* \* \* \* \*